US006861762B1

(12) United States Patent
Rotem

(10) Patent No.: US 6,861,762 B1
(45) Date of Patent: Mar. 1, 2005

(54) FLIP CHIP WITH NOVEL POWER AND GROUND ARRANGEMENT

(75) Inventor: Eran Rotem, Haifa (IL)

(73) Assignee: Marvell Semiconductor Israel Ltd., Misgav (IL)

( * ) Notice: Subject to any disclaimer, the term of this patent is extended or adjusted under 35 U.S.C. 154(b) by 112 days.

(21) Appl. No.: 10/136,119

(22) Filed: May 1, 2002

(51) Int. Cl.[7] .............................................. H01L 23/48
(52) U.S. Cl. ...................... 257/778; 257/355; 257/691; 257/692; 257/207; 257/786
(58) Field of Search ................................ 257/778, 355, 257/786, 357, 356, 360, 361, 690–692, 666, 207, 670

(56) References Cited

U.S. PATENT DOCUMENTS

| | | | |
|---|---|---|---|
| 4,359,754 A | 11/1982 | Hayakawa et al. | |
| 4,403,240 A | 9/1983 | Seki et al. | |
| 5,384,487 A | 1/1995 | Rostoker et al. | |
| 5,641,978 A * | 6/1997 | Jassowski | 257/203 |
| 5,719,449 A * | 2/1998 | Strauss | 257/786 |
| 5,838,072 A | 11/1998 | Li et al. | |
| 5,869,870 A | 2/1999 | Lin | |
| 5,905,639 A | 5/1999 | Warren | |
| 5,960,262 A | 9/1999 | Torres et al. | |
| 5,986,345 A | 11/1999 | Monnot | |
| 6,025,616 A | 2/2000 | Nguyen et al. | |
| 6,043,539 A | 3/2000 | Sigasawara | |
| 6,078,068 A * | 6/2000 | Tamura | 257/203 |
| 6,091,140 A | 7/2000 | Toh et al. | |
| 6,097,098 A | 8/2000 | Ball | |
| 6,107,681 A | 8/2000 | Lin | |
| 6,144,093 A | 11/2000 | Davis et al. | |
| 6,169,331 B1 | 1/2001 | Manning et al. | |
| 6,169,772 B1 * | 1/2001 | Fourcroy | 375/354 |
| 6,211,565 B1 | 4/2001 | Yu | |
| 6,222,213 B1 * | 4/2001 | Fujiwara | 257/210 |
| 6,246,113 B1 | 6/2001 | Lin | |
| 6,372,627 B1 * | 4/2002 | Ring et al. | 438/622 |
| 6,489,688 B1 * | 12/2002 | Baumann et al. | 257/786 |
| 6,495,925 B1 * | 12/2002 | Lee et al. | 257/786 |
| 6,518,089 B2 * | 2/2003 | Coyle | 438/106 |
| 6,570,251 B1 * | 5/2003 | Akram et al. | 257/738 |

OTHER PUBLICATIONS

U.S. Appl. No. 10/051,965, Liou, filed Jan. 16, 2002.
U.S. Application No. 09/966,914, filed Sep. 27, 2001.

* cited by examiner

Primary Examiner—Son L. Mai
Assistant Examiner—Andy Huynh

(57) ABSTRACT

A flip chip assembly comprising a semiconductor die having a core area and a periphery area. The periphery area including an ESD structure. The semiconductor die includes at least one power conductor to supply power between the core area and the periphery. A substrate is coupled to the semiconductor die via a plurality of electrically conductive bumps. A first connection circuit is located within the semiconductor die core area to couple power between the substrate and the semiconductor die power conductor. An electrically conductive bump provides a connection between the first connection circuit and the substrate. The ESD structure is coupled to the first connection circuit.

19 Claims, 3 Drawing Sheets

FLIP CHIP WITH NOVEL POWER AND GROUND ARRANGEMENT

CROSS-REFERENCE TO RELATED APPLICATIONS

The content of co-pending U.S. application Ser. No. 10/051,965, filed Jan. 16, 2002, is herein incorporated by reference in its entirety.

TECHNICAL FIELD

An aspect of the present invention relates to power and ground distribution in flip chip assemblies.

BACKGROUND

A flip chip assembly uses a process in which the semiconductor die is assembled face down onto a substrate. To electrically connect the die to the substrate, a redistribution layer (RDL) is formed over the top metal layer of the semiconductor die to interconnect the die input/output (I/O) circuitry located at the periphery, to Under Ball Metallization (UBM) which may be located anywhere on the surface of the die. Conductive bumps connect the UBM to the substrate.

Conventional flip chip assemblies distribute power and ground from the I/O to the circuits of the semiconductor die. Relatively high voltage drops and power losses can occur in distributing power and ground, due to the distance from the I/O to the circuits and the magnitude of the currents. To reduce the voltage drops and power losses some flip chip assemblies locate the power and ground I/O towards the center of the die. Although relocating the power and ground I/O decreases the voltage drops and power losses, the relocated power and ground I/O may crowd out UBM from the core area of the semiconductor die. Since electrostatic discharge (ESD) structures are typically co-located with the power and ground UBMs, the problem with crowding out in the core area is exacerbated.

SUMMARY

A flip chip assembly is provided comprising a semiconductor die and a substrate. The semiconductor die has a core area and a periphery area and includes at least one power conductor to supply power between the core area and the periphery. The periphery includes an ESD structure. The substrate is coupled to the semiconductor die via a plurality of electrically conductive bumps. A first connection circuit is located within the semiconductor die core area to couple power between the substrate and the semiconductor die power conductor. An electrically conductive bump provides a connection between the first connection circuit and the substrate. The ESD circuit is located outside of the semiconductor die core area and is coupled to the first connection circuit.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
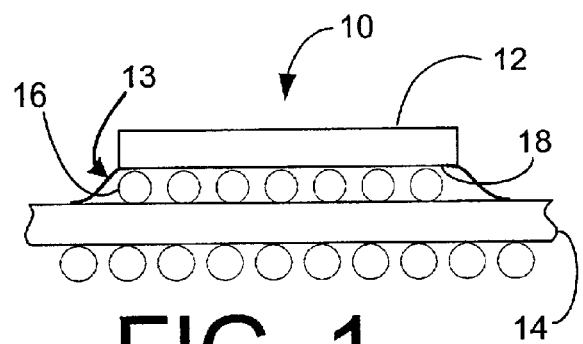
FIG. 1 shows a side-view of a flip chip assembly in accordance with the principles of the invention.

FIG. 1 shows one aspect of a flip chip assembly 10 in accordance with the principles of the invention. The flip chip assembly 10 includes a semiconductor die 12 having a metallization layer 18 coupled to a substrate 14 through one or more conductive bumps 16. Any type of substrate 14 may be employed including circuit boards, carriers, and intermediate substrates. The conductive bumps 16 may be formed from any electrically conductive material such as Pb/Sn solder, Au, Ag, alloys of Au and Ag, and metallic coated polymeric studs. In addition, an epoxy 13 or other suitable material formed between the conductive bumps 16 may be used as an embedding material for the conductive bumps 16 to provide mechanical support and moisture protection. The semiconductor die 12 may be attached to the substrate 14 using any flip chip compatible bonding method such as thermocompression, soldering, encapsulation, and adhesives.

Figure 2:
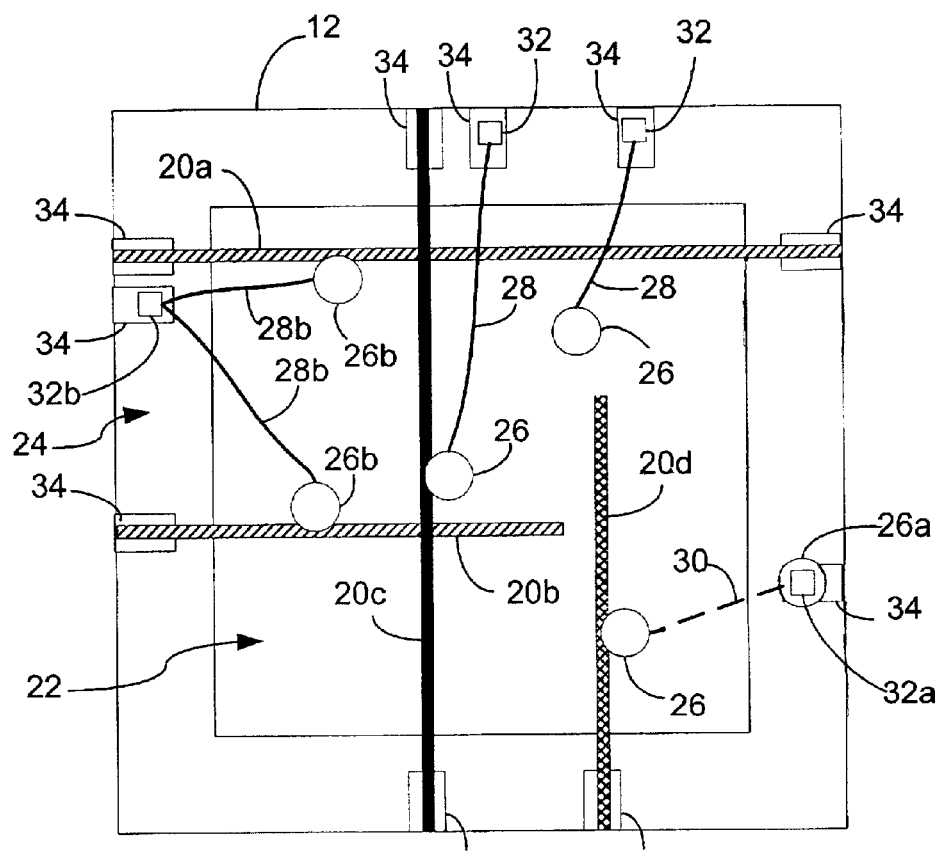
FIG. 2 shows a top view of a semiconductor die in a accordance with the principles of the invention.

FIG. 2 shows a metallization layer side of the semiconductor die 12. The semiconductor die 12 is defined by a periphery area 24 and a core area 22. An ESD structure is fabricated within the periphery area 24 as a part of the fabrication of the semiconductor die 12. The periphery area 24 includes input/output circuitry (I/O) such as outputs, bi-directional I/Os, power, and ground. The core area 22 includes one or more power conductors 20a–20d to distribute power to the circuits within the die 12. The power conductors 20a–20d may distribute any voltage potential including ground potential, high potential, and low potential. In addition, multiple power conductors may distribute the same voltage potential. Each of the power conductors 20a–20d may include a connection circuit 26 for coupling power between the substrate 14 and the associated power conductor 20a–20d.

Figure 3:
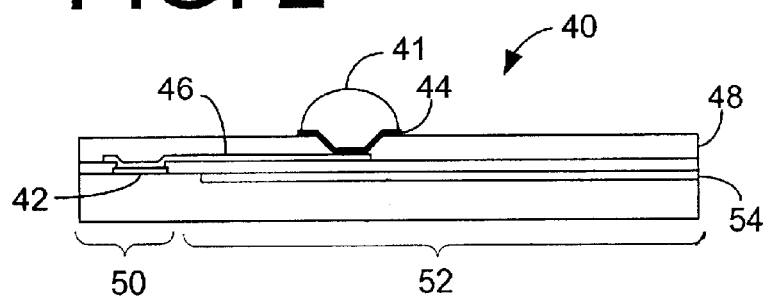
FIG. 3 shows a side-view of another semiconductor die in accordance with the principles of the invention.

The connection circuit 26 employed depends on the specific flip chip process that is used to construct the flip chip assembly. Preferably, a solder bump flip chip process is employed. However, any flip chip process in which the metallized layer of the semiconductor die is connected to a substrate through bumps of electrically conducting material is within the scope of the invention. FIG. 3 shows a partial cross-section of a semiconductor die 40 having a solder bump 41 connected to an existing input/output bond pad 42. The solder bump 41 is connected to the bond pad 42 through under bump An metallization (UBM) 44 and a conductive trace 46 on a redistribution layer 48. The bond pad 42 is located in a periphery area 50 of the semiconductor die 40. The UBM 44 is located in a core area 52 of the semiconductor 40 which is where most of the active circuits 54 of the semiconductor 40 are located. Solder bumps may also be placed directly on existing bonding pads (not shown) as well as reconfigured bonding pads (not shown). Redistributing connections power and ground from the bond pads 42 in the periphery area 50 to UBM 44 in the core area 52 may advantageously reduce voltage drops and power loss within the semiconductor die 12, increase the packaging density, lower assembly cost, improve high frequency performance, and improve reliability.

Referring to FIG. 2, conductive traces 28 and 30 connect the connection circuits 26 to bond pads 34 located in the periphery area 24. The conductive traces 28 and 30 may be located on either the semiconductor die 12 (shown by traces 28) or on the substrate 14 (shown by trace 30). The conductive traces 2B and 30 may also connect the connection circuits 26 to ESD structures 32 that are located outside of the core area 22. The ESD circuits 32 suppress the build-up of electrical charge on corresponding conductors to protect circuits that are connected to the conductors. The ESD structures 32 are preferably located in the periphery area 24. An additional connection circuit 26a is placed over the ESD structure 32a to contact a conductive trace 30 on the substrate 14 that interconnects the two connection circuits once the semiconductor die 12 and substrate 14 are assembled.

A single ESD structure 32b may provide ESD protection to more than one connection circuit 26b. Conductive traces 28b from each of the connection circuits 26b connect to the single ESD structure 32b. The conductive traces 28b may also be routed on the substrate 14 in similar manner to that disclosed above.

The invention recognizes that by locating the ESD structure 32 outside of the core area 22 within the periphery area 24, the demand for area within the core area is reduced, resulting in improved conductor routing and placement of UBM within the core area, additional area in the core area for more connection circuits, and for core limited devices the die size area may be reduced. In addition, when the ESD structures are located in the core area, each ESD structure typically requires a guard ring. Whereas, when grouped in the periphery, the ESD structures may be abutted to other ESD structures, reducing the area required for guard rings.

Figure 4:
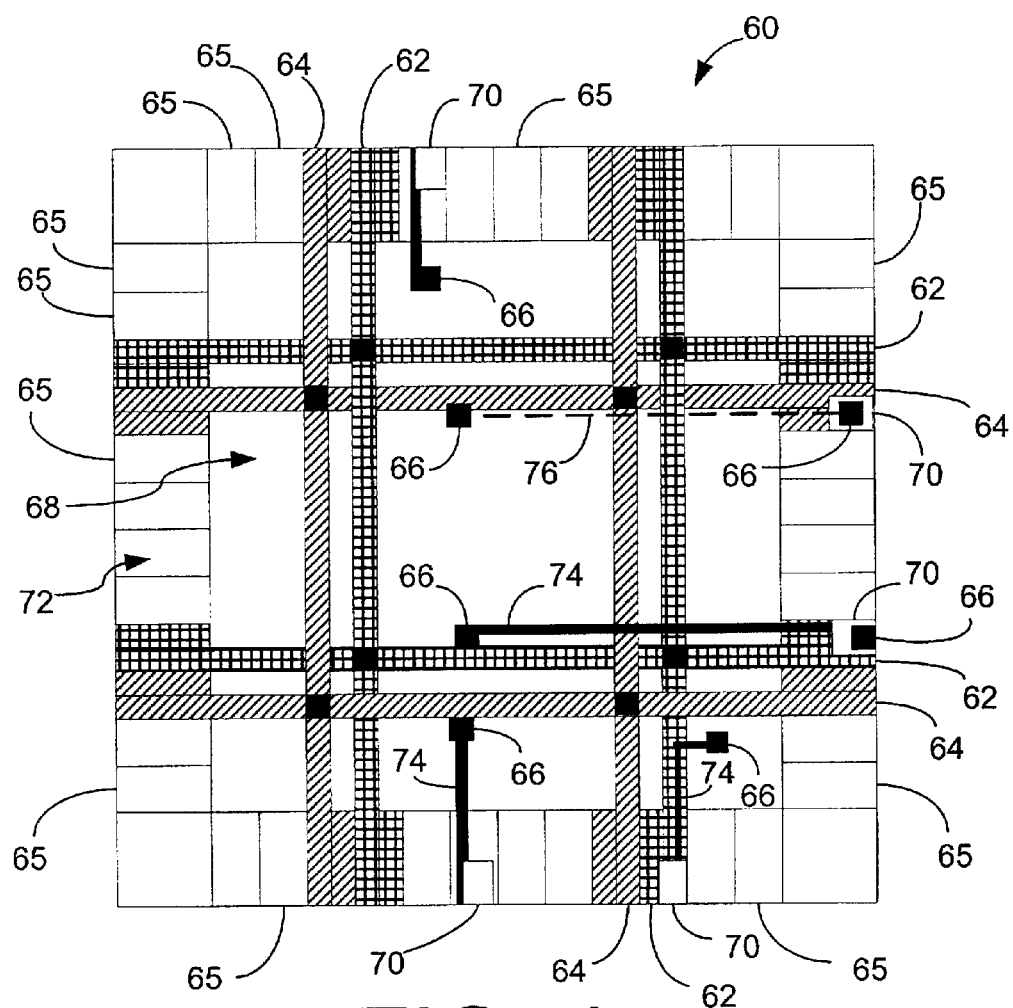
FIG. 4 shows a top-view of another flip chip assembly in accordance with the principles of the invention.

FIG. 4 shows another embodiment of a semiconductor die 60 in accordance with the teachings of the invention. The semiconductor die 60 includes Vss and Vdd power conductors 62 and 64 extending from I/O pads 65 at a periphery 72 of the semiconductor die into a core area 68 of the semiconductor die 60. UBM 66 are located over the power conductors 62 and 64 within the core area 68 to connect the power conductors 62 and 64 to a substrate (not shown). ESD structures 70 associated with the UBM 66 are located within the periphery 72 as part of the I/O pad 65. The UBM 66 are connected to the ESD structures 70 through either redistribution layer conductors 74 or substrate conductors 76.

Figure 5:
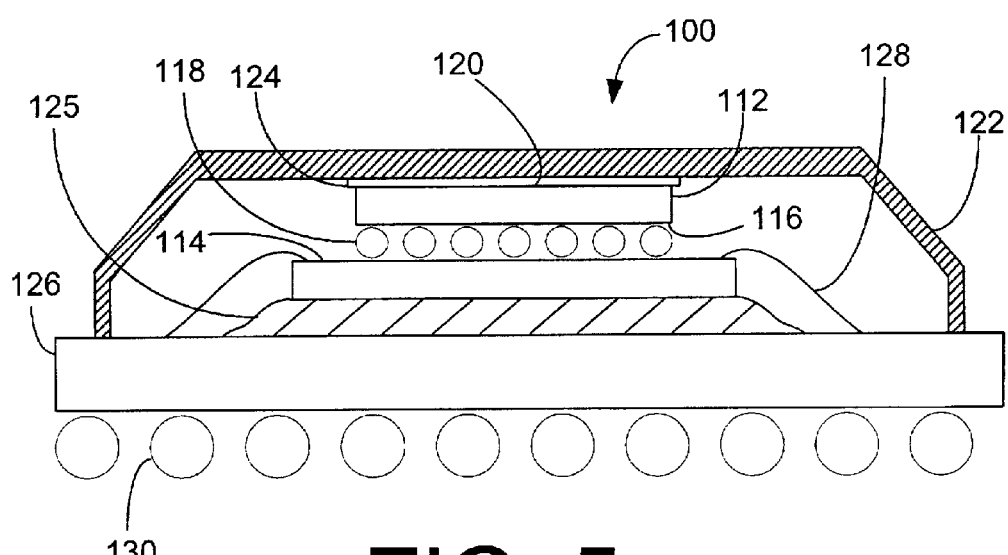
FIG. 5 shows a method of manufacturing a flip chip assembly in accordance with the principles of the invention.

FIG. 5 shows another integrated circuit package 100 that may be used in conjunction with the principles of the invention. The integrated circuit package 100 is disclosed in co-pending U.S. application Ser. No. 09/966,914, filed Sep. 27, 2001, which is hereby incorporated by reference in its entirety. The integrated circuit package 100 is a modified flip chip ball grid array (FCBGA) that can advantageously dissipate approximately the same amount of heat as a flip chip package at a much lower cost. In addition, the thermal path of the integrated circuit package 100 extends away from the circuit board to reduce the heat load on the circuit board.

The integrated circuit package 100 includes a semiconductor die 112 configured for flip chip mounting that is attached to an intermediate substrate 114. A first surface 116 of the semiconductor die 112 is electrically connected to the intermediate substrate 114 via conductive bumps 118.

The other surface 120 of the semiconductor die 112 is attached to a heat sink 122 for coupling heat away from the semiconductor die 112. The heat sink 122 may be made of any thermally conductive material such as copper and thermally conductive plastic. The semiconductor die 112 may be attached to the heat sink 122 by any attachment item 124 that does not thermally isolate the semiconductor die 112 such as adhesive, solder, and press-fitting by applying a mechanical force to the first surface of the semiconductor die 112 or the intermediate substrate 114. For example, a thermally conductive epoxy may be used as the attachment item 124.

The intermediate substrate 114 is electrically connected to conductors on a package substrate 126 via several bonding wires 128. The intermediate substrate 114 converts flip chip mounting of the semiconductor die 112 into wire bond mounting to combine and exceed the advantages of FCBGA and plastic ball grid array (PBGA). Similar to FCBGA, the integrated circuit package 100 provides a low resistance thermal path for heat generated in the semiconductor die 112 so that power dissipation exceeding 20 watts may be accommodated. In addition, the thermal path of the integrated circuit package 100 extends to the heat sink 122, away from the package substrate 126, thereby reducing the heat load of the circuit board or circuit substrate to which the integrated circuit package 100 is connected. Also, the integrated circuit package may employ a substrate that is as inexpensive as substrates used for PBGA packages. Additionally, using the intermediate substrate 114 reduces the wiring pitch requirements on bonding wire equipment used for attaching the bonding wires 128.

The intermediate substrate 114 may be made from any substrate material such as normal silicon wafer (either low or high quality), polysilicon, and glass. Circuit planes such as power planes, ground planes, and interconnect planes may be added to the intermediate substrate 114. The process technology used for the circuit planes is not limited to the technology used for the semiconductor die 112. Instead, other process technologies including lower cost technologies such as 1 micron technology may be employed to reduce the cost of the package 100. The circuit planes may provide interconnect within the semiconductor die 112 as well as to the package substrate 26 through the bonding wires 128. Including circuit planes in the intermediate substrate 114 may reduce the requirement for expensive power and ground grids on the semiconductor die 112. For example at 0.13 um, each layer of metalization costs about 10 times more than the cost of providing the same function on the intermediate substrate 114. Moreover, the semiconductor die 112 may employ distributed power and ground conductive bumps to achieve substantially lower impedance. Decoupling capacitors may be included on the intermediate substrate to provide local filtering of power and ground signals. Providing local filtering is particularly advantageous in view of the high DC and AC currents that may flow between the intermediate substrate 114 and the semiconductor die 112. For example, in a 20 watt device operated with 1 volt supply voltage, the DC current is 20 amps with an AC current that may be 150 amps. In view of such high magnitude AC currents, providing local filtering with low inductance paths is crucial to maintain a relatively constant supply voltage. The decoupling capacitors may include one or more small capacitors as well as a single large parallel plate capacitor covering the whole substrate. The values of the capacitors may be controlled by varying the thickness and area of the dielectric. For example, the value of a parallel plate capacitor may be controlled by varying the thickness of a layer of silicon between the metallized plates. Additional capacitor materials may be used that otherwise are generally not used in advanced wafer fabrication because of concerns with contaminating the wafer. Examples of capacitor materials include standard oxides and nitride oxides. In addition, trench capacitors may be formed on the intermediate substrate 114. Trench capacitors advantageously provide higher volumetric efficiency than parallel plate capacitors. Practically one entire side of the intermediate substrate 114 may be used for decoupling capacitors, as well as portions of the other side of the intermediate substrate 114.

The package substrate 126 may be made of any substrate material suitable for ball grid array mounting to a device such as a circuit board or substrate. Additionally, a support layer 125 such as an epoxy or other suitable material may be inserted between the intermediate substrate 114 and the package 126 to provide addition mechanical support.

Although the above example describes a single intermediate substrate having a single semiconductor die that is attached, the scope of the invention includes more than one intermediate substrate per package and attaching more than one semiconductor die to each intermediate substrate. The semiconductor dies may be any combination of logic circuits and power devices including all logic devices, all power devices, or a mix of logic devices and power devices. The intermediate substrate may be used to provide interconnects within the semiconductor dies, among the semiconductor dies, and from the semiconductor dies to the conductive bumps. Thousands of bonding wires may be provided between the intermediate substrate and the package substrate for very low cost. Since many of the interconnects between the semiconductor dies may be made on the intermediate substrate, the quantity of bonding wire interconnects within the integrated chip package may be significantly reduced. This is particularly advantageous with system on a package (SOP), where the power dissipation of devices within the package exceeds 20 watts.

Figure 6:
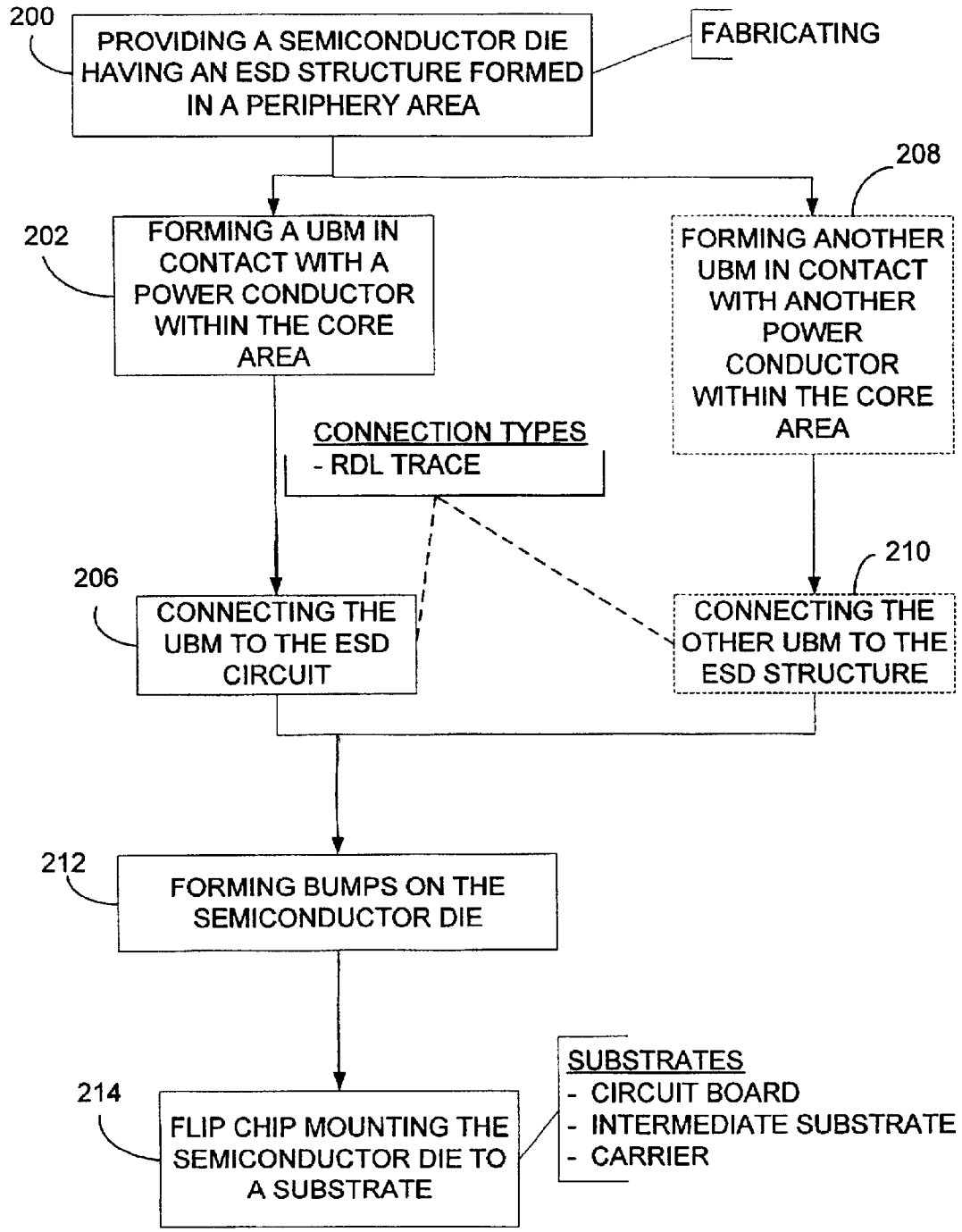
FIG. 6 illustrates steps of a method for forming a flip chip device.

Shown in FIG. 6 is a method of manufacturing a flip chip assembly 10 in accordance with one aspect of the principles of the invention. At block 200 a semiconductor die to be packaged is fabricated having an ESD structure located in a periphery area. Continuing to block 202, a redistribution layer is formed over the semiconductor die. The redistribution layer may form a UBM in the core area of the semiconductor die to contact with a power conductor. Continuing to block 206, the redistribution layer may include a conductive trace to electrically connect the UBM to the ESD structure. At block 208, the redistribution layer may form another UBM within the core area contacting another power conductor. Continuing on to block 210, the redistribution layer may connect the other UBM to the ESD structure through a conductive trace. At block 212, bumps may be formed on the semiconductor die. Continuing to block 214, the semiconductor die is flip chip mounted to a substrate.

A number of embodiments of the invention have been described. It is expressly intended that the foregoing description and accompanying drawings are illustrative of preferred embodiments only, not limiting, and that the true spirit and scope of the present invention will be determined by reference to the appended claims and their legal equivalent. It will be equally apparent and is contemplated that various modifications and/or changes may be made in the illustrated embodiments without departure from the spirit and scope of the invention. For example, the steps of the method of manufacturing may be performed in numerous different sequences. Accordingly embodiments are within the scope of the following claims.

What is claimed is:

1. A flip chip assembly, comprising:

a semiconductor die having a core area and a periphery area, the periphery area including an electrostatic discharge (ESD) structure, and the semiconductor die including at least one power conductor to supply power between the core area and the periphery;

a substrate coupled to the semiconductor die via a plurality of electrically conductive bumps;

a first connection circuit located within the semiconductor die core area to couple power between the substrate and the semiconductor die power conductor, an electrically conductive bump to connect between the first connection circuit and the substrate; and the ESD structure coupled to the first connection circuit.

2. The flip chip assembly of claim 1 wherein the first connection circuit is selected from the group consisting of bond pads and under ball metallization (UBM).

3. The flip chip assembly of claim 1 further comprising a second connection circuit located over and electrically coupled to the ESD structure; and the substrate including a first conductive trace to couple the first connection circuit to the second connection circuit such that the ESD structure is coupled to the first connection circuit through the first conductive trace.

4. The flip chip assembly of claim 1 wherein the semiconductor die further comprises a second conductive trace coupled between the first connection circuit and the ESD structure.

5. The flip chip assembly of claim 4 wherein the semiconductor die further comprises a redistribution layer; and the redistribution layer includes the second conductive trace.

6. The flip chip assembly of claim 1 further including at least a third connection circuit located in the semiconductor die core area to couple power between the substrate and the semiconductor die power conductor, the third connection circuit coupled to the ESD structure.

7. The flip chip assembly of claim 1 wherein the substrate is selected from the group consisting of circuit boards, carriers, and intermediate substrates.

8. A flip chip assembly, comprising:

a semiconductor die having a core area and a periphery area, the periphery area including an electrostatic discharge (ESD) structure, and the semiconductor die including at least one power conductor to supply power between the core area and the periphery;

a substrate coupled to the semiconductor die via a plurality of electrically conductive bumps;

a first under ball metallization (UBM) located within the semiconductor die core area to couple power between the substrate and the semiconductor die power conductor, an electrically conductive bump to connect between the first UBM and the substrate; and the ESD structure coupled to the first UBM.

9. The flip chip assembly of claim 8 further comprising a second UBM located over and electrically coupled to the ESD structure; and the substrate including a first conductive trace to couple the first UBM to the second UBM such that the ESD structure is coupled to the first UBM through the first conductive trace.

10. The flip chip assembly of claim 8 wherein the semiconductor die further comprises a second conductive trace coupled between the first UBM and the ESD structure.

11. The flip chip assembly of claim 10 wherein the semiconductor die further comprises a redistribution layer; and the redistribution layer includes the second conductive trace.

12. The flip chip assembly of claim 8 further including at least a third UBM located in the semiconductor die core area, the third UBM coupled to the ESD structure.

13. The flip chip assembly of claim 8 wherein the substrate is selected from the group consisting of circuit boards, carriers, and intermediate substrates.

14. A flip chip assembly, comprising:

a semiconductor die having a core area and a periphery area, the periphery area including an electrostatic discharge (ESD) means and including at least one means for supplying power;

a substrate coupled to the semiconductor die via a plurality of electrically conductive bumps;

first means for coupling power located within the semiconductor die core area to couple power between the substrate and the semiconductor die power conductor, an electrically conductive bump to connect between the first means for coupling power and the substrate; and the ESD means coupled to the first means for coupling power.

15. The flip chip assembly of claim 14 further comprising second means for coupling power located over and electrically coupled to the ESD means; and the substrate including a first conductive trace to couple the first means for coupling power to the second means for coupling power such that the ESD means is coupled to the first means for coupling power through the first conductive trace.

16. The flip chip assembly of claim 14 wherein the semiconductor die further comprises a second conductive trace coupled between the first means for coupling power and the ESD means.

17. The flip chip assembly of claim 16 wherein the semiconductor die further comprises a redistribution layer; and the redistribution layer includes the second conductive trace.

18. The flip chip assembly of claim 14 further including at least third means for coupling power located in the semiconductor die core area, and the third means for coupling power being coupled to the ESD means.

19. The flip chip assembly of claim 14 wherein the substrate is selected from the group consisting of circuit boards, carriers, and intermediate substrates.

* * * * *

UNITED STATES PATENT AND TRADEMARK OFFICE
CERTIFICATE OF CORRECTION

PATENT NO. : 6,861,762 B1
APPLICATION NO. : 10/136119
DATED : March 1, 2005
INVENTOR(S) : Eran Rotem It is certified that error appears in the above-identified patent and that said Letters Patent is hereby corrected as shown below:

Column 2, Line 57    Delete "An" after "bump"
Column 3, Line 9     Delete "2B" and insert --28--

Signed and Sealed this

Twenty-sixth Day of June, 2007

JON W. DUDAS
*Director of the United States Patent and Trademark Office*